United States Patent
Tzu et al.

(10) Patent No.: US 10,235,555 B2
(45) Date of Patent: Mar. 19, 2019

(54) OPTICAL FINGERPRINT RECOGNITION SENSOR PACKAGE

(71) Applicant: TRON INTELLIGENCE INC., Zhubei (TW)

(72) Inventors: Da-Ching Tzu, Zhubei (TW); Ruey-Jiann Lin, Zhubei (TW)

(73) Assignee: Tron Intelligence Inc., Zhubei (TW)

( * ) Notice: Subject to any disclaimer, the term of this patent is extended or adjusted under 35 U.S.C. 154(b) by 0 days.

(21) Appl. No.: 15/869,323

(22) Filed: Jan. 12, 2018

(65) Prior Publication Data

US 2018/0144175 A1 May 24, 2018

Related U.S. Application Data

(60) Provisional application No. 62/425,715, filed on Nov. 23, 2016.

(51) Int. Cl.
*H01L 31/167* (2006.01)
*G06K 9/00* (2006.01)
(Continued)

(52) U.S. Cl.
CPC ....... *G06K 9/0004* (2013.01); *G06K 9/00013* (2013.01); *H01L 24/16* (2013.01); *H01L 25/165* (2013.01); *H01L 25/167* (2013.01); *H01L 27/14618* (2013.01); *H01L 27/14678* (2013.01); *H01L 31/167* (2013.01); *H05K 1/181* (2013.01); *H01L 27/14636* (2013.01); *H01L 2224/16245* (2013.01); *H01L 2924/12041* (2013.01);
(Continued)

(58) Field of Classification Search
CPC .......... G06K 9/00013; G06K 9/0004; H01L 31/167; H01L 25/167; H01L 25/165; H01L 27/14618; H01L 27/14636; H01L 24/16; H01L 27/14678; H01L 2224/16245; H01L 2924/12041; H05K 1/181; H05K 2201/10106; H05K 2201/10151
See application file for complete search history.

(56) References Cited

U.S. PATENT DOCUMENTS

2003/0184885 A1* 10/2003 Tansho ............... G02B 7/022
359/819
2003/0215117 A1* 11/2003 Hata ............... G06K 9/0004
382/124
(Continued)

*Primary Examiner* — Thanh T Nguyen
(74) *Attorney, Agent, or Firm* — Rosenberg, Klein & Lee

(57) ABSTRACT

An optical fingerprint recognition sensor package, which comprises a carrier, at least one image sensor, at least one light emitting diode, a first molding compound and at least one second molding compound is provided. The image sensor is disposed on the carrier and being electrically connected thereto. The at least one light emitting diode is peripherally surrounding the image sensor for providing at least one light source. The first molding compound made of infrared material is configured to be adjacent to the image sensor to hinder ambient lights from interfering with the image sensor. The second molding compound made of colored silicone is disposed over the light emitting diode to provide lighting path for the light source. By employing the proposed present invention, interferences from the ambient lights with the image sensor can be effectively avoided, thus increasing the accuracy and precision of the sensing results.

16 Claims, 4 Drawing Sheets

(51) Int. Cl.
  *H01L 23/00*   (2006.01)
  *H01L 27/146*  (2006.01)
  *H05K 1/18*    (2006.01)
  *H01L 25/16*   (2006.01)

(52) U.S. Cl.
  CPC .............. *H05K 2201/10106* (2013.01); *H05K 2201/10151* (2013.01)

(56) References Cited

U.S. PATENT DOCUMENTS

| | | | |
|---|---|---|---|
| 2011/0254108 A1* | 10/2011 | Gozzini | G06K 9/00053 257/415 |
| 2013/0063399 A1* | 3/2013 | Noro | G06F 1/1616 345/175 |
| 2016/0104940 A1* | 4/2016 | Wang | H01Q 1/2283 343/836 |
| 2017/0160131 A1* | 6/2017 | Goldring | G01J 3/0264 |

\* cited by examiner

OPTICAL FINGERPRINT RECOGNITION SENSOR PACKAGE

REFERENCE TO RELATED APPLICATION

This Patent Application is based on U.S. Provisional Patent Application Ser. No. 62/425,715, filed 23 Nov. 2016.

BACKGROUND OF THE INVENTION

Field of the Invention

The present invention relates to an optical package structure, and more particularly to an optical fingerprint recognition sensor package.

Description of the Prior Art

Typically, the use of biometric data such as fingerprints in a security system, for example, portable communication devices (i.e. mobile phone, a tablet PC), financial transactions, home-based security and so on, may ensure efficient and accurate protection since fingerprints can be regarded as a certain kind of unique and standard manner of a person's distinctive identity verification. In general, fingerprints have a great number of features including ridges, valleys, and finer points, and a finer point includes a bifurcation where a ridge is branched and an end point where the ridge ends. Since one's fingerprints and its corresponding characteristics always differ from person to person, it can be adopted as a person's distinctive identity verification and widely utilized in a variety of technical fields.

For instance, a fingerprint recognition apparatus is essentially needed in those technical fields when security verifications are needy. When speaking of mechanisms of fingerprint recognition technology, as far as we know, there are mainly two types of fingerprint recognition apparatuses used in recent technology, such as a semiconductor type and an optical type according to their different mechanism. However, since the structure of the semiconductor type is usually much more complicated and requires high complexity when being manufactured, the optical type is advantageous and profitable instead. In general, an optical type fingerprint recognition is characterized by its optical imaging and optical sensing technique, in which at least one light source and an image sensor are certainly necessary. Moreover, in a typical design, a printed circuit board, a base, and an additional blocking-bar element are utilized as well. The base, the light source and the blocking-bar element are mounted upon the printed circuit board, and the image sensor is disposed on the base. The blocking-bar element plays a certain role in order to hinder the miscellaneous lights from interfering with the image sensor. However, so far as we know, this is not very effective. And an even worse problem is, by disposing an existence of the blocking-bar element, it usually results in an uneven distribution of the emitted light source, thereby affecting the estimated consequence of the image sensor and accuracy of the sensing and recognition outcomes.

Therefore, on account of above, to overcome the above-mentioned problem, it should be obvious that there is indeed an urgent need for the professionals in the field for a new optical fingerprint recognition sensor package to be developed that can effectively solve those above mentioned problem occurring in the prior design.

SUMMARY OF THE INVENTION

In order to overcome the above-mentioned disadvantages, one major objective in accordance with the present invention is provided for a novel optical fingerprint recognition sensor package. By employing the optical fingerprint recognition sensor package of the present invention, it can be utilized so as to filter the ambient lights and/or miscellaneous lights from interfering with the image sensor and to increase the accuracy and precision of the sensing and recognition results.

For achieving the above mentioned objectives, the present invention provides an optical fingerprint recognition sensor package, which comprises a carrier, at least one image sensor, at least one light emitting diode, a first molding compound and at least one second molding compound. The at least one image sensor is disposed on the carrier and being electrically connected with the carrier. The at least one light emitting diode is peripherally surrounding the at least one image sensor for providing at least one light source. As such, when a user's fingerprint is generated for recognition, the at least one light source is provided for lighting and helping the at least one image sensor to capture and sense an image of the fingerprint. The first molding compound is configured to be adjacent to the at least one image sensor so as to hinder ambient lights from interfering with the image sensor. The at least one second molding compound is disposed over the at least one light emitting diode and providing at least one lighting path for the at least one light source respectively. By employing the proposed present invention, interferences from the ambient lights with the image sensor can be effectively avoided, thus increasing the accuracy and precision of the sensing and recognition results.

In one embodiment of the present invention, the carrier can be a substrate. In other embodiment of the present invention, the carrier alternatively can be a lead frame as well. The carrier may further comprise a first part and at least one second part respectively for disposing the image sensor and the at least one light emitting diode, and the first part and the at least one second part of the carrier are separated.

In one embodiment, the image sensor is electrically connected with the at least one second part of the carrier by conductive wire bonding. And the at least one light emitting diode is electrically connected with the at least one second part of the carrier by conductive wire bonding.

According to one embodiment of the present invention, the first molding compound can be configured to be covering the at least one image sensor for blocking the ambient lights from interfering with the image sensor. The at least one second molding compound can be configured to be covering the at least one light emitting diode. Furthermore, the at least one second molding compound can be configured to be covering the first molding compound as well.

Furthermore, according to another embodiment of the present invention, the first molding compound can also be configured to be on at least one sidewall of the at least one image sensor. And, the at least one second molding compound is configured to be disposed in between the first molding compound and the at least one light emitting diode. By such designs, interferences from the ambient lights with the image sensor can also be successfully depressed.

In one embodiment, the at least one image sensor is connected with the carrier through a plurality of pads, and the at least one light emitting diode is connected with the carrier or the lead frame through an adhesive layer by surface-mount technology (SMT). The light emitting diode is flip-chip mounted upon the carrier or the lead frame through the adhesive layer. And the adhesive layer can be a red glue or alternatively be a silver paste.

In one embodiment, the at least one image sensor is a charge-coupled device (CCD) or a complementary metaloxide-semiconductor (CMOS). The at least one light emitting diode is an infrared (IR) LED. Accordingly, the first molding compound is made of infrared (IR) molding compound. And the at least one second molding compound is made of colored silicone.

As a result, it is apparent that the present invention successfully adopts two different molding compounds, i.e. the first molding compound made of infrared (IR) material and the second molding compound made of colored silicone, to respectively correspond to the image sensor and the light emitting diode for blocking and filtering the ambient lights from interfering with the image sensor. Thus, miscellaneous interferences from the ambient lights are tremendously decreased, meanwhile, enhancing the accuracy and precision of the sensing result of the present invention.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
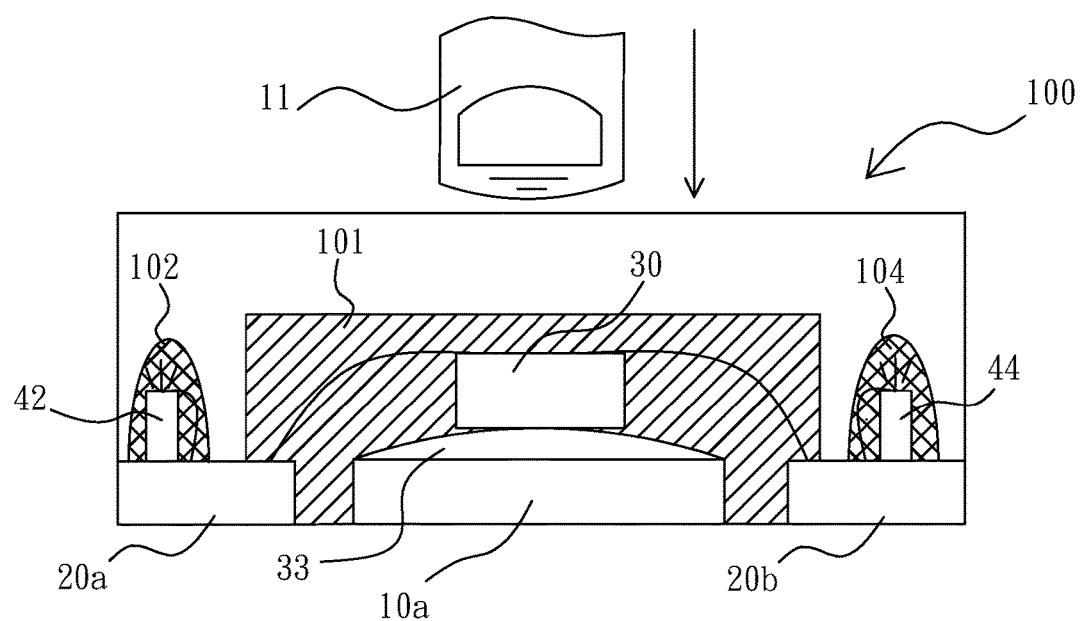
FIG. 1 shows a cross sectional view of an optical fingerprint recognition sensor package in accordance with a first embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

The present invention discloses an optical fingerprint recognition sensor package which can be utilized for eliminating interferences from the ambient lights and meanwhile increasing both the light sensing and recognition efficiency. Please refer to FIG. 1 first, which shows a cross sectional view of an optical fingerprint recognition sensor package in accordance with a first embodiment of the present invention. As shown in FIG. 1, the optical fingerprint recognition sensor package 100 of the present invention comprises at least: a carrier, at least one image sensor 30, at least one light emitting diode 42,44, a first molding compound 101 and at least one second molding compound 102,104. According to one embodiment of the present invention, the carrier can be a substrate or alternatively a lead frame, and the carrier comprises a first part 10a and at least one second part 20a,20b for respectively disposing the above mentioned image sensor 30 and the light emitting diode 42,44. According to the embodiment of the present invention, the first part 10a of the carrier and the second part 20a,20b of the carrier are separated. The image sensor 30 is electrically connected with the second part 20a,20b of the carrier by conductive wire bonding, and each of the light emitting diode 42,44 is electrically connected with the second part 20a,20b of the carrier by conductive wire bonding as well.

In one embodiment, the light emitting diode 42,44 is an infrared (IR) LED, being mounted on the second part 20a,20b of the carrier through an adhesive layer by surface-mount technology (SMT). In general, the adhesive layer for example can be a red glue or a silver paste. As such, the light emitting diode 42,44 can be flip-chip mounted upon the second part 20a,20b of the carrier through the adhesive layer.

The image sensor 30 may be a commonly used charge-coupled device (CCD) or a complementary metal-oxide-semiconductor (CMOS), which is disposed on the first part 10a of the carrier and being electrically connected with the first part 10a of the carrier through pad 33. According to the embodiment of the present invention, it should be noticed that how the image sensor 30 of the present invention is mounted upon the first part 10a of the carrier is not limited, and should comprise both designs of Ball Grid Array (BGA) and Land Grid Array (LGA).

The light emitting diodes 42,44 are peripherally surrounding the image sensor 30 for providing at least one light source. Therefore, as shown in FIG. 1, when a user's fingerprint 11 is generated for recognition, for example, in portable communication devices (i.e. mobile phone, a tablet PC), financial transactions, or home-based security, the light emitting diodes 42,44 give enough light source for lighting and helping the image sensor 30 to capture and sense an image of the fingerprint for verification.

Practically, as far as we know, since the ambient lights will always generate unexpected interferences with the image sensor 30, thus affecting its sensing accuracy, one major objective of the present invention is to eliminate these interferences from the ambient lights, such as visible lights and/or sunlight. What the present invention proposes is to adopt a first molding compound 101 and at least one second molding compound 102,104 which are individually made of different material so as to hinder these interferences from disturbing the sensing results of the image sensor 30. For instance, the first molding compound 101 is made of infrared (IR) molding compound and the second molding compound 102,104 is made of colored silicone. The present invention proposes at least four different embodiments below to fully explain how they work in order to achieve the major objective of the present invention. In the following, we will get started with the first embodiment as shown in FIG. 1.

According to the first embodiment of the present invention, as seen, the first molding compound 101 is configured to be adjacent to the image sensor 30. More specifically, the first molding compound 101 is covering the image sensor 30. The second molding compound 102,104 is respectively covering the light emitting diodes 42,44 for providing at least one lighting path for the at least one light source. By such arrangements, since the image sensor 30 is covered within the first molding compound 101 which is made of infrared (IR) molding material, only wavelengths exceeding 800 nm (a wavelength of infrared light) of the light source can pass through it. In other words, light sources having wavelengths less than 800 nm, i.e. visible lights, and/or sunlight will be blocked out, thereby making no interferences with the image sensor 30. As a result, by employing this manner of design, it is apparent that one major objective of the present invention is accomplished, and interferences from the ambient lights with the image sensor 30 can be effectively avoided.

Figure 2:
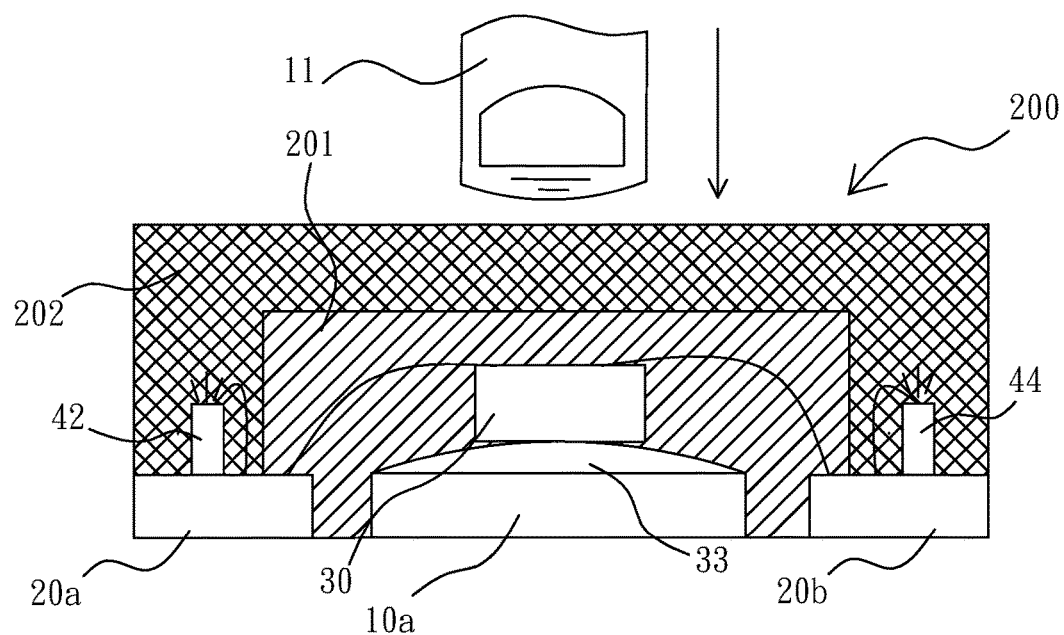
FIG. 2 shows a cross sectional view of an optical fingerprint recognition sensor package in accordance with a second embodiment of the present invention.

Next, please refer to FIG. 2, which shows a cross sectional view of an optical fingerprint recognition sensor package in accordance with a second embodiment of the present invention. As shown in FIG. 2, the optical fingerprint recognition sensor package 200 of the present invention comprises at least: a carrier, at least one image sensor 30, at least one light emitting diode 42,44, a first molding compound 201 and at least one second molding compound 202. According to one embodiment of the present invention, the carrier is a substrate or alternatively a lead frame, and the carrier comprises a first part 10a and at least one second part 20a,20b for respectively disposing the above mentioned image sensor 30 and the light emitting diode 42,44. In one embodiment, the light emitting diode 42,44 is an infrared (IR) LED, being mounted on the second part 20a,20b of the carrier through an adhesive layer by surface-mount technology (SMT). In general, the adhesive layer for example can be a red glue or a silver paste. As such, the light emitting diode 42,44 can be flip-chip mounted upon the second part 20a,20b of the carrier through the adhesive layer.

The image sensor 30 may be a commonly used charge-coupled device (CCD) or a complementary metal-oxide-semiconductor (CMOS), which is disposed on the first part 10a of the carrier and being electrically connected with the carrier through pad 33. According to the embodiment of the present invention, it should be noticed that how the image sensor 30 of the present invention is mounted upon the first part 10a of the carrier is not limited, and should comprise both designs of Ball Grid Array (BGA) and Land Grid Array (LGA). The light emitting diodes 42,44 are peripherally surrounding the image sensor 30 for providing at least one light source. Therefore, as shown in FIG. 2, when a user's fingerprint 11 is generated for recognition, for example, in portable communication devices (i.e. mobile phone, a tablet PC), financial transactions, or home-based security, the light emitting diodes 42,44 give enough light source for lighting and helping the image sensor 30 to capture and sense an image of the fingerprint for verification.

What makes the second embodiment to be different from the previous first embodiment of the present invention is that, in FIG. 2 the second molding compound 202 of the second embodiment further covers the first molding compound 201. In other words, the first molding compound 201 which is made of infrared (IR) molding compound is covering the image sensor 30, and the second molding compound 202 which is made of colored silicone covers both the light emitting diodes 42,44 and the first molding compound 201. By such arrangements, light sources having wavelengths less than 800 nm, i.e. visible lights, and/or sunlight will also be blocked out, thereby making no interferences with the image sensor 30, which can be utilized to achieve the major objective of the present invention as well.

Figure 3:
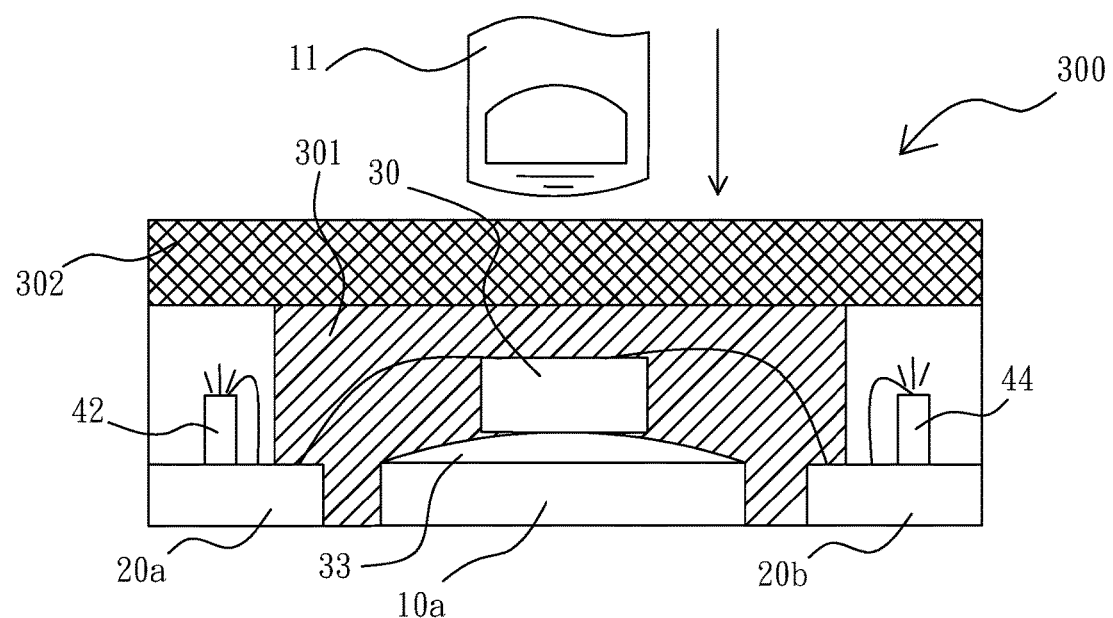
FIG. 3 shows a cross sectional view of an optical fingerprint recognition sensor package in accordance with a third embodiment of the present invention.

In addition, FIG. 3 shows a cross sectional view of an optical fingerprint recognition sensor package in accordance with a third embodiment of the present invention. As shown in FIG. 3, the optical fingerprint recognition sensor package 300 of the present invention comprises at least: a carrier (10a, 20a, 20b), at least one image sensor 30, at least one light emitting diode 42,44, a first molding compound 301 and at least one second molding compound 302. The first part 10a of the carrier and at least one second part 20a,20b of the carrier are used for respectively disposing the above mentioned image sensor 30 and the light emitting diode 42,44. According to the embodiment of the present invention, the first part 10a of the carrier and the second part 20a,20b of the carrier are separated. The image sensor 30 is electrically connected with the second part 20a,20b of the carrier by conductive wire bonding, and each of the light emitting diode 42,44 is electrically connected with the second part 20a,20b of the carrier by conductive wire bonding as well.

According to this embodiment of the present invention, the light emitting diode 42,44 is an infrared (IR) LED, being mounted on the second part 20a,20b of the carrier through an adhesive layer by surface-mount technology (SMT). The image sensor 30 (a commonly used charge-coupled device (CCD) or a complementary metal-oxide-semiconductor (CMOS)) is disposed on the first part 10a of the carrier and being electrically connected with the first part 10a of the carrier through pad 33. In the third embodiment of the present invention as shown in FIG. 3, it is obvious that the first molding compound 301 which is made of infrared (IR) molding compound is covering the image sensor 30, and more importantly, the second molding compound 302 which is made of colored silicone, nevertheless does not necessarily cover and embrace the light emitting diode 42,44 like the previously described embodiments shown in FIG. 1 and FIG. 2. As it can be seen from FIG. 3, as long as the second molding compound 302 is disposed over a top of the light emitting diode 42,44, thus providing lighting path for its emitted light source as well as the image sensor 30 is fully contained and embraced within the first molding compound 301, interferences from the outer environment, i.e. ambient lights including visible lights, sunlight and/or light sources having wavelengths less than 800 nm, with the image sensor 30 can be successfully avoided as well. As a result, it is apparent that FIG. 3 shows a variational type of embodiment of the present invention and can be used for great effects and achieving the major objective of the present invention as well.

Figure 4:
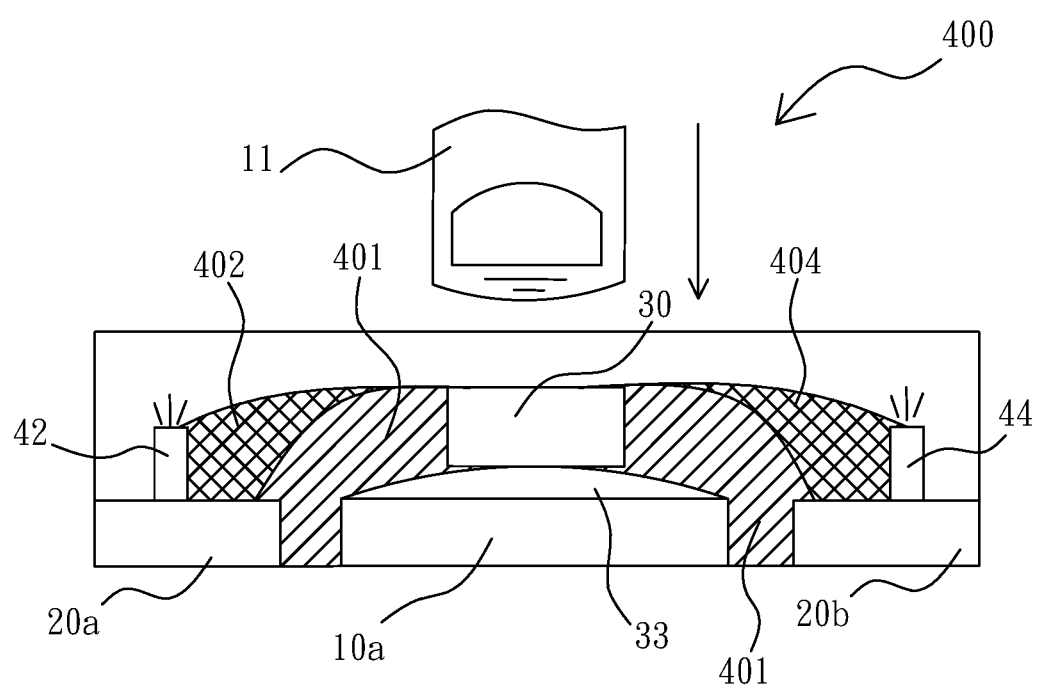
FIG. 4 shows a cross sectional view of an optical fingerprint recognition sensor package in accordance with a fourth embodiment of the present invention.

Furthermore, please refer to FIG. 4, which shows a cross sectional view of an optical fingerprint recognition sensor package in accordance with a fourth embodiment of the present invention. As shown in FIG. 4, the optical fingerprint recognition sensor package 400 of the present invention comprises at least: a carrier (10a, 20a, 20b), at least one image sensor 30, at least one light emitting diode 42,44, a first molding compound 401 and at least one second molding compound 402,404. The first part 10a of the carrier and at least one second part 20a,20b of the carrier are used for respectively disposing the above mentioned image sensor 30 and the light emitting diode 42,44. According to the embodiment of the present invention, the first part 10a of the carrier and the second part 20a,20b of the carrier are separated. The image sensor 30 is electrically connected with the second part 20a,20b of the carrier by conductive wire bonding, and each of the light emitting diode 42,44 is electrically connected with the second part 20a,20b of the carrier by conductive wire bonding as well.

The light emitting diode 42,44 is an infrared (IR) LED, being mounted on the second part 20a,20b of the carrier for providing at least one light source. The image sensor 30 is a charge-coupled device (CCD) or a complementary metal-oxide-semiconductor (CMOS) disposed on the first part 10a of the carrier and being electrically connected with the first part 10a of the carrier through pad 33. According to the embodiment of the present invention, similarly, how the image sensor 30 of the present invention is mounted upon the carrier is not limited, and should comprise both designs of Ball Grid Array (BGA) and Land Grid Array (LGA).

Therefore, as shown in FIG. 4, when a user's fingerprint 11 is generated for recognition, the light emitting diodes 42,44 give enough light source for lighting and helping the image sensor 30 to capture and sense an image of the fingerprint for verification. As we can see from the fourth embodiment of the present invention in FIG. 4, the first molding compound 401 is configured to be adjacent to the image sensor 30. More specifically, the first molding compound 401 is disposed on at least one sidewall of the image sensor 30, and the second molding compound 402,404 is respectively disposed in between the first molding compound 401 and the light emitting diodes 42,44 for providing at least one lighting path for the at least one light source.

Therefore by such arrangements, since the image sensor 30 is covered within the first molding compound 401 which is made of infrared (IR) molding material, only wavelengths exceeding 800 nm (a wavelength of infrared light) of the light source can pass through it. That is to say, light sources having wavelengths less than 800 nm, i.e. visible lights, and/or sunlight will be filtered, thereby making no interferences with the image sensor 30. As a result, by employing this manner of design, it is believed that interferences from the ambient lights with the image sensor 30 are significantly depressed and thus one major objective of the present invention is accomplished as well. It fully explains how this indeed offers another variational type of embodiment of the present invention and can be used for great effects as well.

Moreover, it is believed that the optical fingerprint recognition sensor package of the present invention employs the QFN (Quad-Flat-No-Lead) process designs, nevertheless, the present invention is certainly not limited thereto.

As a result, to sum up, the present invention certainly provides a novel and inventive optical fingerprint recognition sensor package which have never been seen or proposed ever before. The proposed invention employs two types of molding compounds which are individually made of different materials in order to correspond to or cover the image sensor and the light emitting diode, respectively. For example, the infrared material molding compound (i.e. the first molding compound of the present invention) is used for corresponding to or covering the image sensor. The colored silicone material molding compound (i.e. the second molding compound of the present invention) is used for corresponding to or covering the light emitting diode. As a result, the image sensor is embraced within the first molding compound, and the light source emitted from the light emitting diode can be guided and well controlled within the light path which the second molding compound provides. Thus, only wavelengths exceeding 800 nm (a wavelength of infrared light) of the light source can pass through it. And, light sources having wavelengths less than 800 nm, i.e. ambient lights including visible lights, and/or sunlight will be filtered, thereby making no interferences with the image sensor. In other words, miscellaneous lights and interferences from the ambient lights with the image sensor are accordingly and dramatically prevented, thereby enhancing sensing accuracy and precision of the optical fingerprint recognition sensor package of the present invention.

Furthermore, as compared to the prior design, although the present invention utilized double layers of molding compounds, the present invention proposed an optical fingerprint recognition sensor package, which employs the QFN (Quad-Flat-No-Lead) process designs so as to reduce the thickness of its package structure. As a result, it is believed that the proposed optical fingerprint recognition sensor package is advantageous of not only thin thickness and low fabrication cost, but also less complexity and area consuming. Thus, the Applicants assert that the present invention is instinct, effective and highly competitive for incoming technology, industries and researches developed in the future and shall be patentable soon as well.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An optical fingerprint recognition sensor package, comprising:
    a carrier;
    at least one image sensor disposed on said carrier and being electrically connected with said carrier;
    at least one light emitting diode, peripherally surrounding said image sensor for providing at least one light source, wherein when a user's fingerprint is generated for recognition, said at least one light source is provided for lighting and helping said image sensor to capture and sense an image of said fingerprint;
    a first molding compound, made of infrared (IR) molding compound and configured to be adjacent to said at least one image sensor so as to hinder ambient lights from interfering with said image sensor; and
    at least one second molding compound, made of colored silicone, disposed over said at least one light emitting diode and providing at least one lighting path for said at least one light source respectively.

2. The optical fingerprint recognition sensor package according to claim 1, wherein said first molding compound is configured to be covering said at least one image sensor.

3. The optical fingerprint recognition sensor package according to claim 2, wherein said at least one second molding compound is configured to be covering said at least one light emitting diode.

4. The optical fingerprint recognition sensor package according to claim 3, wherein said at least one second molding compound is further configured to be covering said first molding compound.

5. The optical fingerprint recognition sensor package according to claim 1, wherein said first molding compound is configured to be on at least one sidewall of said at least one image sensor.

6. The optical fingerprint recognition sensor package according to claim 5, wherein said at least one second molding compound is configured to be disposed in between said first molding compound and said at least one light emitting diode.

7. The optical fingerprint recognition sensor package according to claim 1, further comprising a plurality of pads, which are in connection with said carrier and said at least one image sensor.

8. The optical fingerprint recognition sensor package according to claim 1, wherein said at least one light emitting diode is mounted on said carrier through an adhesive layer by surface-mount technology (SMT).

9. The optical fingerprint recognition sensor package according to claim 8, wherein said adhesive layer is a red glue or a silver paste.

10. The optical fingerprint recognition sensor package according to claim 9, wherein said at least one light emitting diode is flip-chip mounted upon said carrier through said adhesive layer.

11. The optical fingerprint recognition sensor package according to claim 1, wherein said carrier is a substrate or a lead frame.

12. The optical fingerprint recognition sensor package according to claim 1, wherein said at least one light emitting diode is an infrared (IR) LED.

13. The optical fingerprint recognition sensor package according to claim 1, wherein said at least one image sensor is a charge-coupled device (CCD) or a complementary metal-oxide-semiconductor (CMOS).

14. The optical fingerprint recognition sensor package according to claim 1, wherein said carrier further comprises a first part and at least one second part respectively for disposing said image sensor and said at least one light emitting diode, and said first part and said at least one second part are separated.

15. The optical fingerprint recognition sensor package according to claim 14, wherein said image sensor is electrically connected with said at least one second part by conductive wire bonding.

16. The optical fingerprint recognition sensor package according to claim 14, wherein said at least one light emitting diode is electrically connected with said at least one second part by conductive wire bonding.

* * * * *